United States Patent
Basol

(10) Patent No.: US 8,225,742 B2
(45) Date of Patent: Jul. 24, 2012

(54) APPARATUS FOR CONTINUOUS PROCESSING OF BUFFER LAYERS FOR GROUP IBIIIAVIA SOLAR CELLS

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 23 days.

(21) Appl. No.: 12/463,303

(22) Filed: May 8, 2009

(65) Prior Publication Data

US 2009/0223444 A1      Sep. 10, 2009

Related U.S. Application Data

(63) Continuation of application No. 12/037,076, filed on Feb. 25, 2008, now Pat. No. 7,541,067, which is a continuation-in-part of application No. 11/735,430, filed on Apr. 13, 2007, now Pat. No. 7,585,547.

(60) Provisional application No. 60/744,827, filed on Apr. 13, 2006, provisional application No. 60/891,443, filed on Feb. 23, 2007.

(51) Int. Cl.
   *B05C 3/00*      (2006.01)
   *B05D 1/18*      (2006.01)

(52) U.S. Cl. ..................... 118/429; 427/434.2

(58) Field of Classification Search .................. 118/429, 118/419, DIG. 12, 400; 427/294, 129
   See application file for complete search history.

(56) References Cited

U.S. PATENT DOCUMENTS

| | | | | |
|---|---|---|---|---|
| 2,695,421 A | * | 11/1954 | Amundson et al. | 264/70 |
| 3,206,325 A | * | 9/1965 | Averbach | 427/129 |
| 3,934,054 A | * | 1/1976 | Schmeling et al. | 427/8 |
| 4,481,235 A | * | 11/1984 | Foell et al. | 427/74 |
| 4,798,660 A | | 1/1989 | Ermer et al. | |
| 4,915,745 A | | 4/1990 | Pollock et al. | |
| 5,314,710 A | * | 5/1994 | Muroyama | 438/780 |
| 5,410,796 A | | 5/1995 | Weeks, Jr. | |
| 5,476,811 A | | 12/1995 | Fujii et al. | |
| 5,997,956 A | | 12/1999 | Hunt et al. | |
| 6,048,442 A | | 4/2000 | Kushiva et al. | |
| 6,092,669 A | | 7/2000 | Kushiya et al. | |
| 6,277,442 B1 | * | 8/2001 | Beaumont et al. | 427/96.9 |
| 6,537,845 B1 | | 3/2003 | McCandless et al. | |
| 6,547,876 B2 | | 4/2003 | Ferguson et al. | |
| 6,923,625 B2 | | 8/2005 | Sparks et al. | |
| 2001/0006734 A1 | | 7/2001 | Demiryont | |

(Continued)

OTHER PUBLICATIONS

Malinowska et al. Cadmium Recovery and Recycling from Chemical Bath Deposition of CdS Thin Layers, Progress in Photovoltaics: Research and applications, 2002, 10: pp. 215-228.

(Continued)

*Primary Examiner* — Dah-Wei Yuan
*Assistant Examiner* — Charles Capozzi
(74) *Attorney, Agent, or Firm* — Pillsbury Winthrop Shaw Pittman LLP

(57) ABSTRACT

A deposition method which deposits a CdS buffer layer on a surface of a solar cell from a process solution including all chemical components of the CdS buffer layer material. CdS is deposited in a deposition chamber by heating the surface of the solar cell absorber to cause the transfer of heat from the solar cell absorber layer to at least a portion of the process solution that is in contact with the surface. Used solution is cooled, and replenished in a solution container and redirected into the deposition chamber.

11 Claims, 2 Drawing Sheets

U.S. PATENT DOCUMENTS

| | | | | |
|---|---|---|---|---|
| 2003/0230338 | A1* | 12/2003 | Menezes | 136/265 |
| 2004/0096586 | A1* | 5/2004 | Schulberg et al. | 427/372.2 |
| 2005/0263488 | A1* | 12/2005 | Change et al. | 216/83 |
| 2007/0175387 | A1* | 8/2007 | Kimura | 118/429 |

OTHER PUBLICATIONS

Cortes, A., et al., "Grain Size Dependence of the Bandgap in Chemical Bath Deposited CdS Thin Films", Solar Energy Mats. & Solar Cells, vol. 82, pp. 21-34, 2004.

Al Kuhaimi, S.A., et al., "Structural, Compositional, Optical and Electrical Properties of Solution-Growth, $Zn_xCd_{1-x}S$ Films", J. of the Electrochem. Soc., vol. 147, No. 1, pp. 214-218, 2000.

Kylner, A., et al., "Impurities in Chemical Bath Deposited CdS Films for $Cu(ln,Ga)Se_2$ Solar Cells and Their Stability", J. of the Electroche. Soc., vol. 143, No. B, pp. 2662-2669, Aug. 8, 1996.

Voss C., et al. "Growth kinetics of thin-film cadmium sulfide by ammonia-thiourea based CBD" J. of the Electrochemical Society, 151 (10); pp. C655-C660 (2204. cited by other.

* cited by examiner

APPARATUS FOR CONTINUOUS PROCESSING OF BUFFER LAYERS FOR GROUP IBIIIAVIA SOLAR CELLS

This application is a continuation of U.S. application Ser. No. 12/037,076 filed Feb. 25, 2008 now U.S. Pat. No. 7,541,067 entitled "Method and Apparatus for continuous Processing of Buffer Layers for Group IBIIIAVIA Solar Cells", which is a continuation-in-part of U.S. application Ser. No. 11/735,430, filed Apr. 13, 2007 now U.S. Pat. No. 7,585,547 entitled "METHOD AND APPARATUS TO FORM THIN LAYERS OF MATERIALS ON A BASE," which claims priority to U.S. Provisional Application Ser. No. 60/744,827, filed Apr. 13, 2006 and also claims priority to U.S. Provisional Application Ser. No. 60/891,443, filed Feb. 23, 2007, which applications are expressly incorporated by reference herein.

BACKGROUND OF THE INVENTION

1. Field of the Invention

The present invention relates to apparatus for fabricating thin film solar cells employing a chemical bath deposited (CBD) buffer layer. More specifically the present invention describes apparatus for continuous manufacturing of Group IBIIIAVIA solar cells and modules.

2. Description of the Related Art

Solar cells are photovoltaic (PV) devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications. It should be noted that although the chemical formula for the absorbers is often written as $Cu(In,Ga)(S,Se)_2$, a more accurate formula for the compound is $Cu(In,Ga)(S,Se)_k$, where k is typically close to 2 but may not be exactly 2. For simplicity we will, occasionally, continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, Cu(In,Ga)(S,Se)$_2$ means the whole family of compounds with Ga/(Ga+In) molar ratio varying from 0 to 1, and Se/(Se+S) molar ratio varying from 0 to 1.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal (such as aluminum or stainless steel), an insulating foil or web, or a conductive foil or web. The absorber film 12, which includes a material in the family of $Cu(In,Ga,Al)(S,Se,Te)_2$, is grown over a conductive layer 13, which is previously deposited on the substrate 11 and which acts as the electrical contact to the device. The structure including the substrate 11 and the conductive layer 13 or the contact layer, is often called a base 16. Various conductive layers comprising Mo, Ta, W, Ti, and nitrides of these materials etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. It should be noted that the structure of FIG. 1 may also be inverted if substrate is transparent. In that case light enters the device from the substrate side of the solar cell.

In a thin film solar cell employing a Group IBIIIAVIA compound absorber, the transparent layer 14 often comprises a stack structure comprising a buffer layer 17 and a transparent conductive layer 18 as shown in the inset of FIG. 1, which is a cross-sectional view of a portion 19 of the transparent layer 14. The transparent layer 14 itself may comprise a stack such as an undoped-ZnO/doped-ZnO stack, an undoped-ZnO/In—Sn—O (ITO) stack etc. In manufacturing the cell, the buffer layer 17 is first deposited on the Group IBIIIAVIA absorber film 12 to form an active junction. Then the transparent conductive layer 18 is deposited over the buffer layer 17 to provide the needed lateral conductivity.

Various buffer layers with various chemical compositions have been evaluated in solar cell structures. CdS, ZnS, Zn—S—OH, Zn—S—O—OH, ZnO, Zn—Mg—O, Cd—Zn—S, ZnSe, In—Se, In—Ga—Se, In—S, In—Ga—S, In—O—OH, In—S—O, In—S—OH, etc. are some of the buffer layer materials that have been reported in the literature. Buffer layers for Group IBIIIAVIA devices such as CIGS(S) solar cells are typically 5-200 nm thick and may be deposited by various techniques such as evaporation, sputtering, atomic layer deposition (ALD), electrodeposition and chemical bath deposition (CBD), etc.

Chemical bath deposition (CBD) is the most commonly used method for the formation of buffer layers on CIGS(S) absorber films. The technique involves preparation of a chemical bath comprising the chemical ingredients of the buffer layer to be formed. The temperature of the bath is raised to a typical range of 50-90° C. and the surface of the CIGS(S) film is exposed to the heated bath. Alternately, the substrate containing the CIGS(S) film may be heated and then dipped into the chemical bath kept at a lower temperature as described in U.S. Pat. No. 6,537,845. A thin buffer layer grows onto the CIGS(S) film as a result of homogeneous chemical reactions initiating upon application of heat to the bath and/or to the substrate carrying the CIGS(S) film.

An exemplary CBD process for the growth of a cadmium sulfide (CdS) buffer layer employs a chemical bath comprising cadmium (Cd) species (from a Cd salt source such as Cd-chloride, Cd-sulfate, Cd-acetate, etc.), sulfur (S) species (from a S source such as thiourea) and a complexing agent (such as ammonia, triethanolamine (TEA), diethanolamine (DEA), ethylene diamine tetra-acetic acid (EDTA), etc) that regulates the reaction rate between the Cd and S species. Once the temperature of such a bath is increased to the 50-90° C. range, the reaction between the Cd and S species initiates homogeneously everywhere in the solution. As a result, a CdS layer forms on all surfaces wetted by the heated solution and CdS particles form homogeneously within the solution. The reaction rate between Cd and S species is a function of temperature. The rate increases as the temperature is increased and it decreases as the temperature is reduced.

The prior art CBD processes are batch processes. In other words, in these prior-art methods a pre-measured amount of the bath or solution is used to form a buffer layer on a pre-selected surface area of a structure, such as a solar cell structure. After formation of the buffer layer on the pre-selected surface area of the structure, the used bath is discarded along with the particles formed within the bath. As can be appreciated from this brief review, such prior-art approaches generate large amounts of chemical waste and increase cost since actual materials utilization to form the buffer layer on the surface of the structure is very low, typically lower than 20%. Most of the buffer layer material is wasted on forming a film on the walls of the reactor holding the CBD solution, and on forming particles of the buffer layer material within the solution. The present invention increases materials utilization of the CBD processes, reduces waste, and allows continuous deposition of materials on substrates which may be in the form of rolled foils.

SUMMARY OF THE INVENTION

The present invention is related to apparatus for fabricating thin film solar cells employing a chemical bath deposited buffer layer.

In one aspect the, present invention is directed to a system for depositing a buffer layer material from a process solution onto an exposed surface of a solar cell absorber layer formed on a continuous flexible workpiece to manufacture solar cells, the system comprising a chamber to deposit the buffer layer material onto the exposed surface, the chamber comprising: a heated wall that supports and heats the workpiece and the exposed surface to a first temperature that is sufficient to cause deposition of the buffer layer material onto the exposed surface from a portion of the process solution that is in contact with the exposed surface; a cooled wall placed substantially across from the heated wall; a solution inlet to flow the process solution into a gap between the heated wall and the cooled wall and onto the exposed surface at a predetermined rate, wherein the process solution is maintained at a second temperature that is lower than the first temperature; a heating mechanism to heat the heated wall; a cooling mechanism associated with the cooled wall, that cools the cooled wall so that the deposition of the buffer layer material cannot occur on the cooled wall; and a solution outlet to flow the used process solution out of the chamber at a rate that substantially corresponds to the predetermined rate.

In another aspect, the workpiece is a flexible workpiece and the system further comprises a moving assembly to hold and linearly move the flexible workpiece through the chamber, wherein the moving assembly comprises a supply spool to unwrap and feed unprocessed sections of the continuous flexible workpiece into the chamber and a take-up spool to receive processed portions.

DETAILED DESCRIPTION OF THE INVENTION

Figure 1:
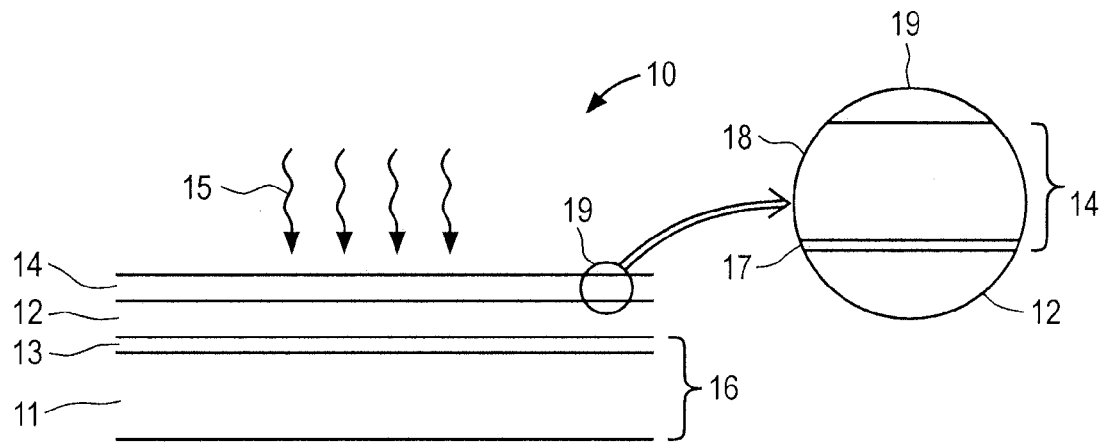
FIG. 1 is a cross-sectional view of a solar cell employing a Group IBIIIAVIA absorber layer.

In one embodiment of the present invention, the CBD solution is heated when the solution is in contact with the surface to be coated and then the solution is cooled down when it is not in contact with the surface to be coated. The cooled solution may then be re-circulated again over the surface to be coated. This way film formation reaction is accelerated on the surface to be coated and homogeneous nucleation within the solution and on surfaces other than the surface to be coated is minimized and materials utilization is improved.

In another embodiment, substantially all surfaces of the reactor walls are covered with the substrates to be coated and therefore deposition and waste of material on reactor walls is eliminated or reduced in the zone where heat is applied to the solution. Yet in an additional embodiment the solution is continually monitored with a monitoring unit in terms of its chemical composition and filtered. If necessary, species are dosed into the solution to keep its chemical composition substantially the same during long periods of time which may be several hours. This way, waste is minimized, materials utilization is further enhanced and continuous deposition of materials on large number of substrates or long sheets of flexible substrates may be achieved. Various aspects of the present invention will now be described using, as an example, CdS buffer layer deposition on a CIGS(S) absorber surface employing a specific chemistry. It should be noted that various other chemistries may be employed in the present invention to deposit various other buffer layer materials listed before.

An exemplary aqueous CdS deposition bath may be formed by mixing in water 1-50 ml of 1M cadmium salt solution, such as Cd-chloride, Cd-sulfate, Cd-acetate, or the like, 1-50 ml of 14.53 M ammonium hydroxide solution as complexing agent, and 1-50 ml of 1M thiourea as S solution. Another complexing agent solution such as 0.5M Triethanolamine (TEA) may also be added in an amount that is in the range of 1-20 ml. A typical bath may contain (by volume) 5-15% cadmium solution, 5-15% complexing agent (ammonium hydroxide), 5-15% S solution (thiourea) and optionally 5-10% of the additional complexing agent solution (TEA), the balance being the solvent, i.e. water.

The typical CBD electrolytes or solutions are quite stable at low temperatures. Homogeneous reactions within such solutions initiate once the temperature is raised, for example, to over 50° C. A bath may be stable for over 5 hours at 20° C., whereas large particles may form within minutes in a bath that is heated up to 80° C. The above mentioned CdS bath acts in a similar fashion. Since the solution is mostly kept at low temperature for the method of the present invention, it is possible to mix all the ingredients of the solution. In prior art techniques it is customary to mix the Cd source and the complexing agent in the solvent, then heat up the solution to 50° C. or higher, and then add the S source, at which time reaction and CdS formation starts.

Figure 2:
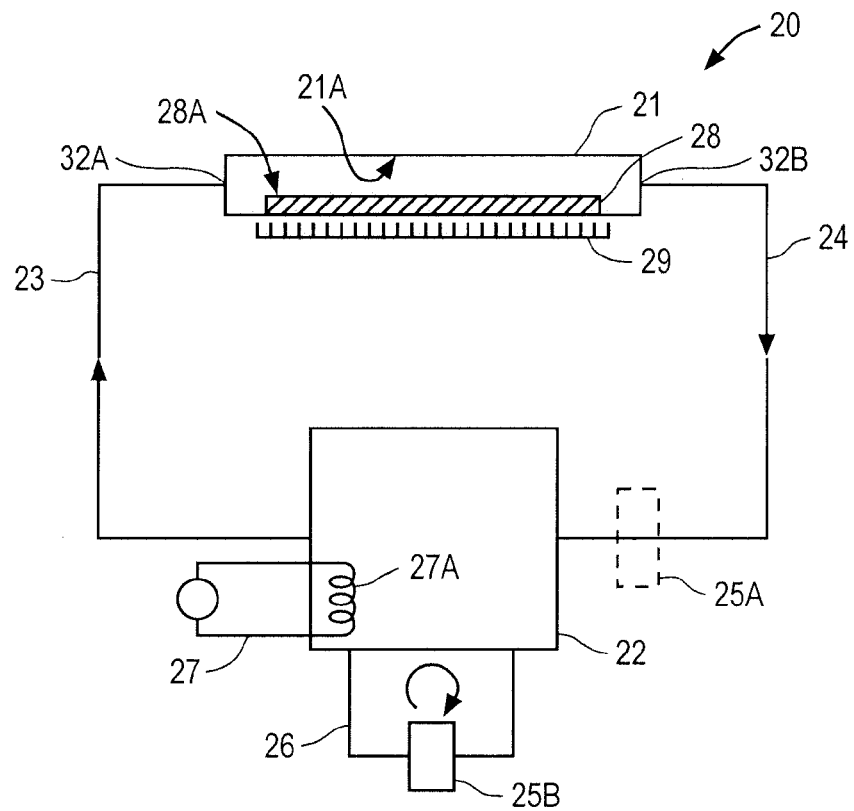
FIG. 2 shows an exemplary buffer layer deposition system.
Figure 2A:
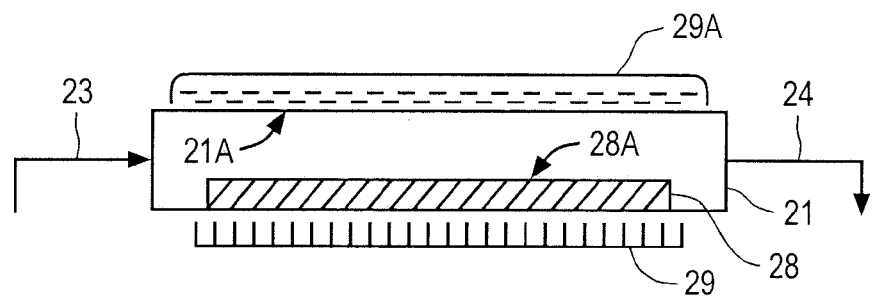
FIG. 2A shows a deposition section employing a heater as well as a cooler.

FIG. 2 is a sketch of a CdS deposition system 20 that may be used to deposit a CdS buffer layer on a surface such as on a CIGS(S) absorber film surface. The CdS deposition system 20 comprises a deposition section 21 having a workpiece entry opening 32A and a workpiece exit opening 32B, a solution container 22, a feed line 23 that carries the solution from the solution container 22 to the deposition section 21 and a return line 24 that carries the solution from the deposition section 21 back to the solution container 22. There may be additional components added to the system 20 of FIG. 2 such as filters 25A on the return line 24, filters (not shown) on the feed line 23, filters 25B on a secondary loop 26 that may circulate the solution within the solution container 22 for the purpose of particle elimination, cooling, mixing etc. There is preferably a cooling loop 27 with a cooling coil 27A within the solution container 22. A cooling liquid may be circulated through the cooling coil 27A to lower the temperature of the bath within the solution container 22. The temperature of the solution within the solution container 22 may be in the range of 5-40 C., preferably in the 15-20 C. range. There is preferably a heater 29 provided to apply heat to a workpiece or structure 28, the exposed surface 28A of which will be coated with CdS. The heater 29 may be a resistance heater, a hot liquid jacket, an infrared lamp heater etc. that is configured to heat up the structure 28 to a process temperature, which may be in the range of 50-90 C. It should be noted that another structure (not shown) and another heater (not shown) may be placed across from the structure 28 so that two such structures are processed face-to-face, at the same time. This way, no CdS deposition is allowed on the exposed wall 21A of the deposition section 21. Yet another design is shown in FIG. 2A. In this case a cooler 29A is provided for the exposed wall 21A of the deposition section 21. This way reaction and deposition of CdS on the exposed wall 21A is greatly reduced or even eliminated. In effect the deposition section 21 becomes a cold-wall reactor where only the wall carrying the structure to be coated with CdS is heated. Other walls are cooled down to keep them clean of CdS deposit.

The apparatus design and the process approach described with respect to FIGS. 2 and 2A heat the solution when it is in contact with the exposed surface 28A of the structure 28. The temperature of the solution contacting the exposed surface 28A may be in the range of 50-90° C., preferably in the range of 55-80° C. The temperature of the solution in the solution container 22, on the other hand may be in the range of 15-20° C. As described before, the solution in the solution container 22 may be cooled down to this temperature range using the secondary loop 26 and/or the cooling loop 27. Alternately, there may be cooler integrated with the return line 24. In this case as the heated solution exits the deposition section 21 and passes through the return line 24 it gets cooled down on its way to the solution container 22. Such an approach is attractive since it cools down the walls of the tubes or other fluid carrier containing the heated solution from the deposition section 21, therefore, reduces or eliminates CdS deposition on such walls.

It should be noted that the preferred method of depositing the CdS layer on the exposed surface 28A (which may be an exposed surface of a CIGS(S) absorber film) of the structure 28 (which may be a substrate/contact layer/CIGS(S) structure) involves direct heating of the structure 28 and thus heating a micro-layer of solution touching the exposed surface 28A. This way, CdS powder formation in the bulk of the solution may be reduced or avoided and deposition primarily takes place on the exposed surface 28A. Such an approach yields very high materials utilization which may be close to 100%. Cooling the solution and re-cycling over the structure is attractive since it allows filtering of formed particles, better uniformity due to controlled liquid flow over the substrate and less chemical waste.

Another method employs heater (not shown) on the feed line 23 so that the solution may be heated to a pre-determined process temperature value before entering the deposition section 21. In this case the heater 29 may or may not be utilized to further heat the structure 28. Similar to the method discussed before, upon exiting the deposition section 21 the solution may be cooled down to a temperature which is lower than the process temperature to reduce powder formation and deposition on the walls of the system. Such temperature lowering may be done within the return line 24 and/or within the solution container 22.

The concepts discussed above have the following unique features that resolve some of the problems associated with prior-art techniques; i) the deposition bath or solution is heated to a process temperature, which may be in the range of 50-90 C, right before it wets the surface to be coated with CdS or during the period when it wets the surface to be coated with CdS, ii) the solution is cooled down to a temperature lower than the process temperature after it is used to coat the surface with CdS, iii) the steps of i) and ii) are repeated either for depositing thicker CdS on the same surface or for depositing CdS on surfaces of new structures introduced into the deposition section in a cyclic or continuous manner. The preferred method involves continuous recycling of the solution between the solution container 22 and the deposition section 21, although intermittent flow of the solution between the deposition section 21 and the solution container 22 may also be utilized. Once the solution is in the solution container 22 it may be analyzed for its composition and ingredients that may be reduced due to reactions may be added to the solution. Such ingredients include but are not limited to water, ammonia, Cd salt, S source, complexing agent etc. By controlling the solution composition this way, the same solution may be used for coating a large number of structures with CdS without replacing the base solution. This reduces waste and thus cost of the process. The base solution may be occasionally replaced with a fresh one if its impurity content increases to a level that may affect the quality of the deposited CdS film. Removal of particles from the solution may be achieved through filtration using various approaches including centrifuging the solution. The CdS particles thus removed may be re-cycled later to form a Cd source for the process.

Figure 3:
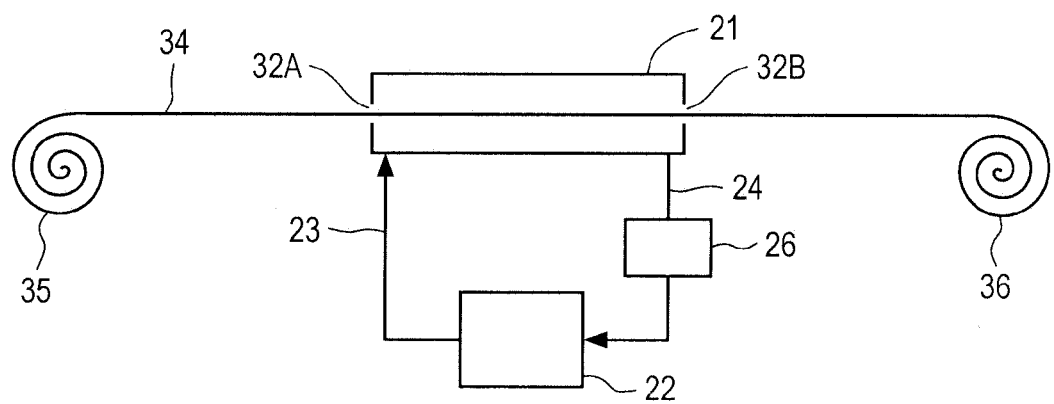
FIG. 3 shows a roll-to-roll deposition system to coat a buffer layer on a flexible structure.

It should be noted that the methods and apparatus of the present invention are well suited for continuous processing such as roll-to-roll processing. Unlike the batch process approach of prior-art methods that uses a given volume of the solution to deposit CdS on a structure with a pre-selected size and discards the used solution, the present method re-cycle and controls the chemical composition of the solution. Thus various portions of a given structure such as a long (e.g. 1000 ft) foil substrate gets exposed to a repeatable process environment (such as a repeatable solution chemistry and repeatable process temperature), as they are moved through a deposition section, typically at a rate of 100 cm/minute-1000 cm/minute. FIG. 3 schematically shows a roll-to-roll deposition system to coat a buffer layer on a flexible structure 34 that is moved from a supply spool 35 into the entry opening 32A of the deposition section 21, through the deposition section section 21, and out of the exit opening 32B of the deposition section 21 to a take-up spool 36. The CBD solution is circulated between a solution container 22 and the deposition section 21 through a feed line 23 and a return line 24 that includes an analyzer 26, as described before. The speed of the flexible structure 34 is adjusted to adjust the residence time of a portion of the flexible structure 34 in the deposition section 21. This residence time, along with the temperature and flow rate of the solution, determines the thickness of the buffer layer deposited on that portion of the flexible structure. A typical flow rate of the solution, both into and out of the deposition section 21, is in the range of 0.1 liter/minute to 10 liters/minute.

Although the present invention is described with respect to certain preferred embodiments, modifications thereto will be apparent to those skilled in the art.

What is claimed is:

1. A system for depositing a buffer layer material from a liquid process solution onto a horizontally disposed flat sheet-shaped exposed top surface of a solar cell absorber layer formed on a continuous flexible workpiece to manufacture solar cells, the system comprising:
    a horizontal chamber to deposit the buffer layer material onto the horizontally disposed flat sheet-shaped exposed top surface of the solar cell absorber layer, the horizontal chamber comprising:
        an entrance opening on a side of the horizontal chamber in which to insert the continuous flexible workpiece into the horizontal chamber;
        a heated wall that supports and heats a part of the continuous flexible workpiece and the horizontally disposed flat sheet-shaped exposed top surface of the solar cell absorber layer corresponding thereto disposed within the chamber to a first temperature that is sufficient to cause deposition of the buffer layer material onto the horizontally disposed flat sheet-shaped exposed top surface of the solar cell absorber layer from a portion of the process solution that is in contact with the horizontally disposed flat sheet-shaped exposed top surface of the solar cell absorber layer;
        a cooled wall placed substantially across from the heated wall, such that the cooled wall, the horizontally disposed flat sheet-shaped exposed top surface of the solar cell absorber layer, and the heated wall are parallel with each other;
        a liquid solution inlet to flow the liquid process solution into a gap between the heated wall and the cooled wall and onto the horizontally disposed flat sheet-shaped exposed top surface of the solar cell absorber layer at a predetermined flow rate, wherein the liquid process solution is maintained at a second temperature that is lower than the first temperature; and
        an exit opening on another side of the horizontal chamber in which to remove the continuous flexible workpiece having the solar cell absorber layer and the buffer layer thereon from the horizontal chamber;
    a heating mechanism to heat the heated wall and activate the deposition of the buffer layer material onto the horizontally disposed flat sheet-shaped exposed top surface of the solar cell absorber layer;
    a cooling mechanism associated with the cooled wall, that cools the cooled wall so that the deposition of the buffer layer material cannot occur on the cooled wall due to the solution flowing adjacent the cooled wall being cooled;
    a liquid solution outlet to flow a used liquid process solution out of the chamber at a flow rate that substantially corresponds to the predetermined flow rate of the liquid process solution; and
    a moving assembly to hold and linearly move the continuous flexible workpiece through the horizontal chamber, wherein the moving assembly comprises a supply spool to unwrap and feed unprocessed sections of the continuous flexible workpiece into the entry opening of the horizontal chamber and a take-up spool to receive processed portions from the exit opening of the horizontal chamber.

2. The system of claim 1 further comprising:
    a solution container connected to the liquid solution inlet and the liquid solution outlet by solution conduits, wherein the used liquid process solution received from the liquid solution outlet is replenished in the solution container and redirected into the horizontal chamber through the liquid solution inlet as the process solution; and
    a solution cooling mechanism to cool the used liquid process solution to the first temperature.

3. The system of claim 2 further comprising a filter placed between the liquid solution outlet and the solution container to filter the used liquid solution to remove particles after depositing the buffer layer material.

4. The system of claim 2, wherein the solution cooling mechanism cools the used liquid solution in the solution container.

5. The system of claim 2, wherein the solution cooling mechanism is located between the solution container and the liquid solution inlet.

6. The system of claim 2, wherein the solution container contains a secondary loop including a filter so that the used liquid solution is removed from the solution container, filtered to obtain a filtered solution, and the filtered solution is redirected to the solution container.

7. The system of claim 1, further comprising an analyzer located between the liquid solution outlet and the solution container to analyze the used liquid solution to determine the amount of depleted components.

8. The system of claim 1, wherein the solution cooling mechanism is located between the liquid solution outlet and the solution container.

9. The system of claim 1, wherein the heating mechanism includes one of a resistance heater, a hot liquid jacket and an infrared lamp heater.

10. The system of claim 1 wherein the cooling mechanism is a cooler that is configured to cool the cooled wall to a temperature range of 14-40° C.

11. The system of claim 10 wherein the heating mechanism is configured to heat the heated wall to a temperature range of 50-90° C.

* * * * *